United States Patent
Ventzek et al.

(10) Patent No.: US 8,889,534 B1
(45) Date of Patent: Nov. 18, 2014

(54) SOLID STATE SOURCE INTRODUCTION OF DOPANTS AND ADDITIVES FOR A PLASMA DOPING PROCESS

(71) Applicant: Tokyo Electron Limited, Tokyo (JP)

(72) Inventors: Peter L. G. Ventzek, Austin, TX (US); Yuuki Kobayashi, Miyagi-Ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/075,453

(22) Filed: Nov. 8, 2013

Related U.S. Application Data

(60) Provisional application No. 61/828,257, filed on May 29, 2013.

(51) Int. Cl.
  *H01L 21/00*  (2006.01)
  *H01L 21/66*  (2006.01)
  *H01L 21/223*  (2006.01)

(52) U.S. Cl.
  CPC ............ *H01L 21/2236* (2013.01); *H01L 22/26* (2013.01)
  USPC .................. 438/513; 427/569; 118/723 MW; 118/723 R

(58) Field of Classification Search
  None
  See application file for complete search history.

(56) References Cited

U.S. PATENT DOCUMENTS

| | | | |
|---|---|---|---|
| 4,536,370 A | | 8/1985 | Hahn |
| 4,891,189 A | | 1/1990 | Harwood, Jr. |
| 4,912,065 A | | 3/1990 | Mizuno et al. |
| 5,074,987 A | | 12/1991 | Thompson |
| 5,476,065 A | * | 12/1995 | Ikezawa et al. ............... 117/217 |
| 5,536,359 A | * | 7/1996 | Kawada et al. ................. 438/16 |
| 5,556,521 A | * | 9/1996 | Ghanbari ................. 204/192.32 |
| 5,573,591 A | * | 11/1996 | Ikezawa et al. ................. 117/20 |
| 6,355,581 B1 | | 3/2002 | Vassiliev et al. |
| 6,475,400 B2 | | 11/2002 | Lammert |
| 6,627,140 B1 | * | 9/2003 | Sato et al. ..................... 264/483 |
| 6,814,811 B2 | | 11/2004 | Ose |

(Continued)

FOREIGN PATENT DOCUMENTS

WO 2011056433 A2 5/2011

OTHER PUBLICATIONS

Evwaraye, A. O., The Role of Oxygen in Irradiated Arsenic-Doped Silicon, Applied Physics Letters, vol. 29, No. 8, Oct. 15, 1976, pp. 476-478.

(Continued)

*Primary Examiner* — Charles Garber
*Assistant Examiner* — Evren Seven
(74) *Attorney, Agent, or Firm* — Wood, Herron & Evans, LLP

(57) ABSTRACT

A method of doping a non-planar surface or a surface of a substrate subject to poor view factors is provided. The processing chamber comprises a window, walls, and a bottom of the processing chamber with oxygen-containing material, the processing chamber configured to supply oxygen radicals as an additive to doping materials. One or more quartz pieces are placed inside the processing chamber, where a magnet proximate to the processing chamber is configured to create a local magnetron plasma inside the processing chamber. Process gas containing an inert gas, sublimated doping materials, and optionally oxygen gas is flowed into the processing chamber; energy is applied to the process gas, generating a doping plasma used to expose a portion of the substrate surface while controlling operating variables to achieve target uniformity of dopant concentration, sheet resistance, degree of dopant clustering, and erosion of features on the substrate.

20 Claims, 12 Drawing Sheets

(56) References Cited

U.S. PATENT DOCUMENTS

| | | | |
|---|---|---|---|
| 7,531,212 B2 * | 5/2009 | Kohara et al. | 427/255.31 |
| 7,977,219 B2 | 7/2011 | Isogai et al. | |
| 8,202,435 B2 | 6/2012 | Tabat | |
| 8,450,819 B2 | 5/2013 | Okumura et al. | |
| 2003/0051658 A1 * | 3/2003 | Nakagawa et al. | 117/13 |
| 2004/0058552 A1 | 3/2004 | Higuchi | |
| 2005/0126711 A1 * | 6/2005 | Kazumi et al. | 156/345.48 |
| 2006/0060796 A1 * | 3/2006 | Subramanian | 250/492.21 |
| 2006/0234519 A1 | 10/2006 | Pan et al. | |
| 2007/0099398 A1 | 5/2007 | Sugawara et al. | |
| 2008/0087972 A1 | 4/2008 | Rao et al. | |
| 2009/0173625 A1 * | 7/2009 | Kohara et al. | 204/298.06 |
| 2009/0181526 A1 * | 7/2009 | Okumura et al. | 438/513 |
| 2010/0095889 A1 | 4/2010 | Kai et al. | |
| 2010/0101728 A1 * | 4/2010 | Iwasaki | 156/345.33 |
| 2011/0086501 A1 | 4/2011 | Papasouliotis et al. | |
| 2012/0034750 A1 | 2/2012 | Sasaki et al. | |
| 2012/0090542 A1 * | 4/2012 | Ruby et al. | 118/712 |
| 2013/0026562 A1 | 1/2013 | Beigel et al. | |
| 2014/0097752 A1 * | 4/2014 | Biloui et al. | 315/111.81 |

OTHER PUBLICATIONS

Kögler, R. et al., Investigation of As—O Clustering in Si, Phys. Stat. Sol (a), 118, 1989, pp. 321-330.

Whelan, S., et al., Dopant Behavior and Damage Annealing in Silicon Implanted with 1 keV Arsenic, Nuclear Instruments and Methods in Physics Research B, 186, 2002, pp. 271-275.

Speidel, R., et al., A Solid State Oxygen Source for UHV, Vaacuum, vol. 38, No. 2, 1988, pp. 89-92.

Elsevier Science Ltd., Dopants in Silicon: Activation and Deactivation Kinetics, 2001, pp. 1-9, published in Encyclopedia of Materials: Science and Technology, ISNB: 0-08-0431526 pp. 2331-2340.

International Search Authority, International Search Report and Written Opinion issued in corresponding Application No. PCT/US14/36583 issued Sep. 19, 2014, 10 pp.

* cited by examiner

SOLID STATE SOURCE INTRODUCTION OF DOPANTS AND ADDITIVES FOR A PLASMA DOPING PROCESS

CROSS-REFERENCE TO RELATED APPLICATIONS

This application is related to U.S. Patent Application Ser. No. 61/828,257 entitled SOLID STATE SOURCE INTRODUCTION OF DOPANTS AND ADDITIVES FOR A PLASMA DOPING PROCESS, filed May 29, 2013, the entire content of which is incorporated herein by reference in its entirety.

FIELD OF THE INVENTION

This disclosure is related to methods and systems for processing a substrate and, more specifically, for a method and system for controlling the operating variables of a doping process to achieve uniformity of dopant concentration, target sheet resistance, and minimize undesirable dopant clustering and erosion of features in the substrate.

BACKGROUND OF THE INVENTION

The fabrication of semiconductor devices including field effect transistors on silicon wafers that are planar or non-planar structures such as silicon nanowires requires methods of doping or activating devices that are not hindered by the lack of planarity. Plasma doping means dopant precursors are added to a gas stream such that the number of dopant atoms is in rough proportion to the number required on the wafer to obtain the desired dose. The feed gas stream includes an inert carrier gas and is very lean with the precursor gas. The precursor gas is dissociated into free dopant atoms in a background plasma and the free atoms along with inert carrier gas ions impinge the wafer, energetic ions amorphize (disorder the first few atomic layers) the surface allowing the dopant atoms to be taken up by the surface. Annealing following the doping process activates the dopants in the sub-surface.

Plasma doping has as its objective the incorporation of dopant species into the silicon sub-surface with control of electrical resistance and junction depth over the non-planar structure. Plasma doping ensures an adequate dose distributed over an appropriate depth in the silicon sub-surface with minimum damage, minimum sacrifice of the active device integrity, and compatibility with subsequent process steps. A key challenge for plasma doping is obtaining adequate dose with good uniformity in the presence of clustering phenomena that occur under high dose conditions.

Some general ways to achieving low sheet resistance include: a) increasing of flow rate of process gas including dopant; and b) increasing of RF bias power on wafer stage. Both simple solutions bring with them significant problems. High dopant flow rates result in dopant clustering, which actually results in dopant loss; flow fields of the dopant coming in may also produce significant uniformity problems. Radio frequency (RF) bias at the wafer leads to erosion by energetic ions and decreasing controllability of the depth of the dopant, referred to as the junction depth, $X_j$.

The clustering of dopant atoms occurs in arsenic, phosphorus and boron doping processes when the dopant concentration exceeds a critical value. In the silicon sub-surface, if dopant atoms concentration exceeds this critical threshold value, the dopant atoms bond to neighboring dopant atoms and vacancy, and form "clusters". In the annealing process, the clusters, usually volatile at elevated temperatures, sublime with loss of dose. Any remaining clusters are electrically inactive and have a non-diffusive character. In arsenic doping, a typical cluster consists of four arsenic atoms and a vacancy. There are many different kinds of clusters. Whatever the kind, they reduce the number of effective carriers and inhibit dopant diffusion. Finally, sheet resistance is increased due to a decreasing of effective carrier density and shallow diffusion depth. To achieve high dose amount and low sheet resistance, processes that inhibit dopant clustering and promote dose uptake are needed.

"Oxidation enhanced diffusion" means that oxygen atoms incorporated in silicon enhance dopant diffusion and inhibit dopant clustering. This phenomenon is known to be effective during process and during annealing. We have re-confirmed that a small amount of oxygen atoms co-incorporated in silicon with dopant atoms also promotes dopant incorporation in plasma doping. With oxidation of the silicon sub-surface during the annealing process, oxygen atom interferes silicon atoms bonding, switches positions with non-bonding silicon atom, and bonds other silicon atoms. Many interstitial silicon atoms are generated. The interstitial silicon atoms unite with vacancies, and decrease vacancy density. The result is that arsenic atoms (exemplary of other dopant species) are unable to find partners (: vacancy) to form the clusters. Clustering is inhibited.

Stress mediated diffusion also plays a role. Oxidation of a surface layer results in a stress field propagating into the film. This effect is seen in other fields such as plasma etches where the presence of an oxide results in "bird's beak" effect at oxide-silicon interfaces. Stress mediated diffusion promotes dopant diffusion.

There are several problems with current additive addition methods. Typically, additive addition methods are used in the annealing step where oxygen gas is added to the annealing ambient which comes with significant problems. Too much oxidation on the silicon surface or other chamber surfaces may occur requiring a cleaning process that lowers throughput.

Introduction of additives in the gas stream is a tempting approach to control additives. The problem of adding oxygen or other precursors into gas streams is that without special solutions, for example, fast gas switching, it is difficult to control the uniformity of the flux of the additive to the wafer. A solution is required to add oxygen or other dopant additives to the plasma doping process as simple solutions such as addition of oxygen to the gas stream, RF bias, and high dopant flow rates are inadequate on their own to provide high dose uniformly across a wafer. There is also a fundamental drawback associated with adding oxygen in the gas stream. Adding oxygen (molecules) in any appreciable amount also increases the degree of electronegativity of the plasma through attachment processes.

SUMMARY OF THE INVENTION

A method of doping a non-planar surface or a surface of a substrate subject to poor view factors is provided. The process chamber comprises a window, walls, and a bottom of the process chamber with oxygen-containing material, the process chamber configured to supply oxygen radicals as an additive to doping materials. One or more quartz pieces are placed inside the process chamber, where a magnet proximate to the process chamber is configured to create a local magnetron plasma inside the process chamber. Process gas containing an inert gas, sublimated doping materials and optionally oxygen is flowed into the process chamber; energy is applied to the process gas, generating a doping plasma used to expose a portion of the substrate surface while controlling operating variables to achieve target uniformity of dopant concentration, sheet resistance, degree of dopant clustering, and erosion of features on the substrate.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to describe the invention.

FIG. 4 is an exemplary architectural diagram of a quartz or alumina window and walls of a processing chamber in an embodiment of the present invention;

DETAILED DESCRIPTION

Figure 1:
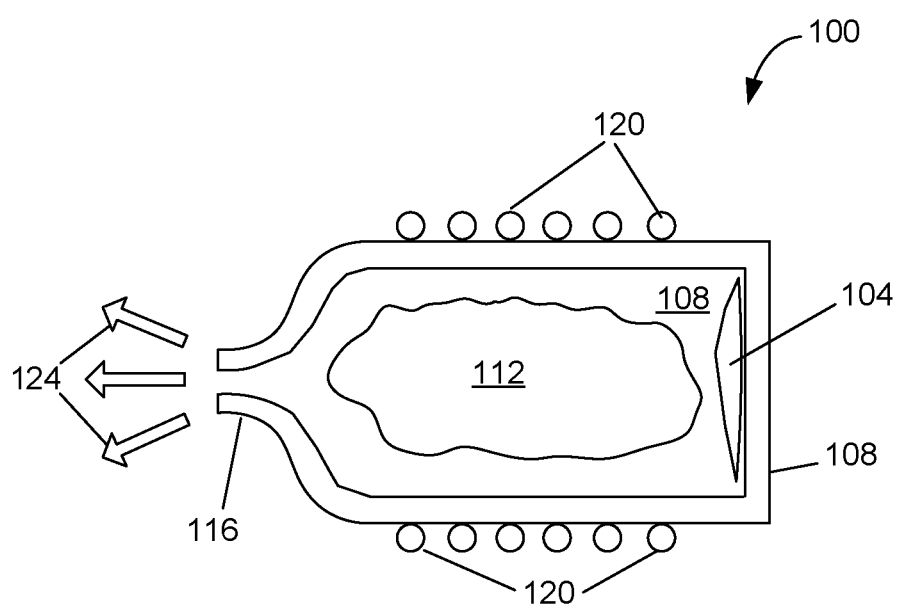
FIG. 1 is an exemplary prior art system using a solid state oxygen source in thermal field emission applications.

Solid state source introduction of dopants and additives for a plasma doping process are disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout. Some devices or components that were previously described may be shown in later figures but not described or referenced so as to maintain the focus on the feature being discussed.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise. Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "radiation sensitive material" means and includes photosensitive materials such as photoresists. As used herein, the term "substrate" or "wafer" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide.

FIG. 1 is an exemplary prior art system 100 using a solid state oxygen source in thermal field emission applications as described by R. Speidel and E. R. Weidlich, "A SOLID STATE OXYGEN SOURCE FOR UHV," FIG. 4 on page 90, of pages 89-92 of Vacuum, Vol. 38, Number 2, 1988, Pergamon Press, PLC. A solid state oxygen source concept is based on heating thermally decomposable metal oxides 104, for example, copper oxide, in a process chamber 108 that is heated by a heating device, for example, heating coils 120.

The dissociated material 112 is further processed in the process chamber by using an ultra high vacuum (UHV) of about $3.5 \cdot 10^{-6}$ mbar and directed through the nozzle 116 as oxygen atoms 124. The direction and rate of flow of oxygen atoms can be controlled using the partial pressure of the oxygen atoms, total pressure of dissociated material 112, and design of the nozzle 116 and the exhaust system (not shown).

Figure 2:
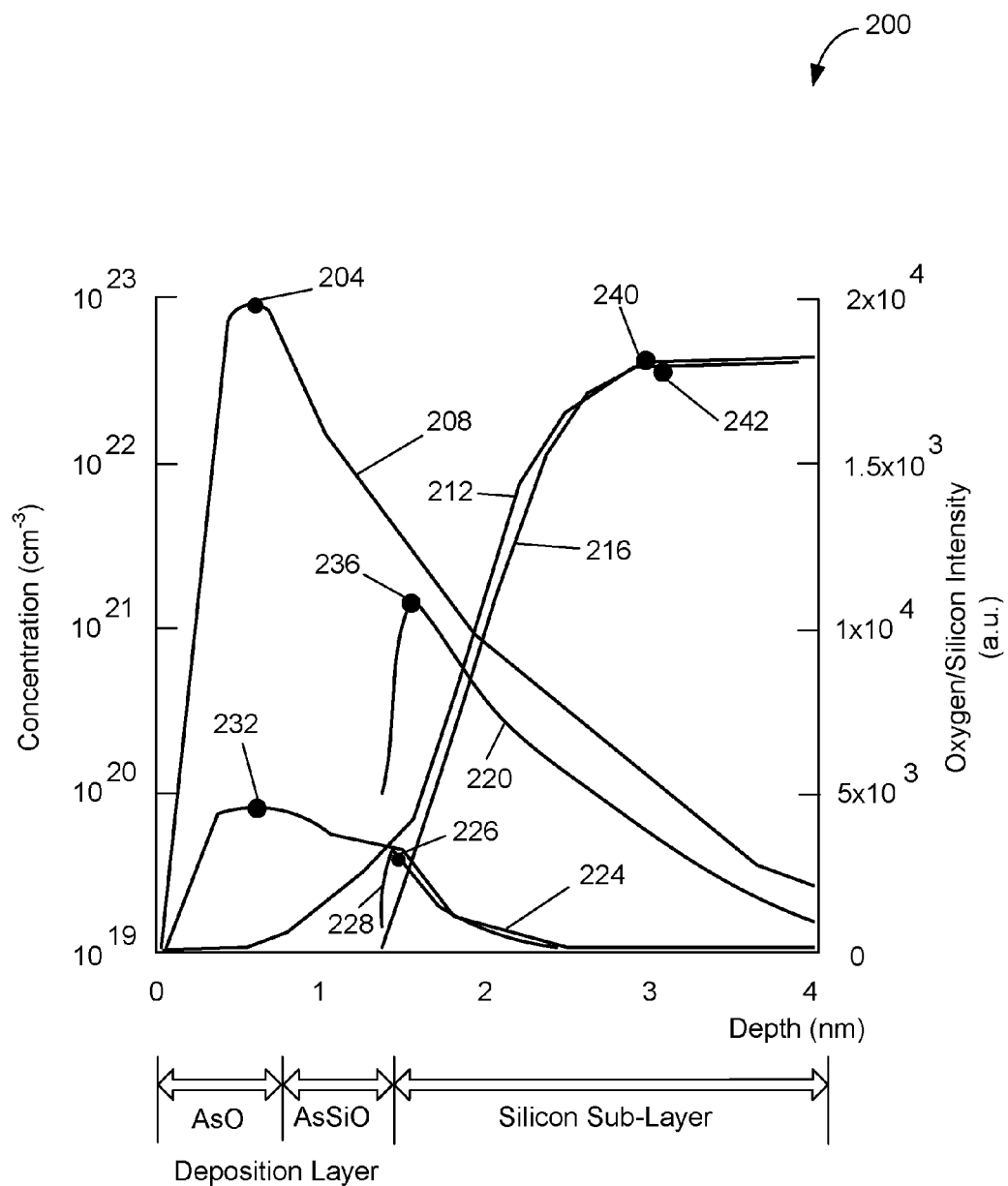
FIG. 2 is an exemplary graph of dopant (arsenic) concentration versus the depth profile of the dopant of the species in silicon layer before and after an annealing process.

FIG. 2 is an exemplary graph 200 of dopant (arsenic) concentration versus the depth profile the dopant of the species in a silicon layer before and after an annealing process. The first Y-axis is the concentration in $cm^{-3}$ of the various dopant layers while the second Y-axis is the concentration of the oxygen/silicon intensity in atomic units, a.u. The X-axis is expressed in depth of the dopant in the substrate case, nm. Prior to the annealing process, the layers of the substrate include an arsenic oxide (AsO) layer, an arsenic silicon oxide (AsSiO) layer, and a silicon sub-layer. The AsO and the AsSiO layers evaporated during the low pressure anneal (LPA) process. The pre-anneal As curve 208 has a peak concentration 204 of about $10^{23}$ atoms $cm^{-3}$ whereas the post anneal As curve 220 has a peak concentration 236 of about $10^{20}$ atoms $cm^{-3}$. The pre-anneal oxygen, O, curve 224 has a peak concentration 232 of about $10^{19.8}$ atoms $cm^{-3}$ whereas the post anneal O curve 228 has a peak concentration 226 of about $10^{19.5}$ atoms $cm^{-3}$. The pre-anneal silicon, Si, curve 212 has a peak concentration 240 of about $10^{27.5}$ atoms $cm^{-3}$ whereas the post anneal Si curve 216 has a peak concentration 242 of about $10^{27.6}$ atoms $cm^{-3}$.

Figure 3:
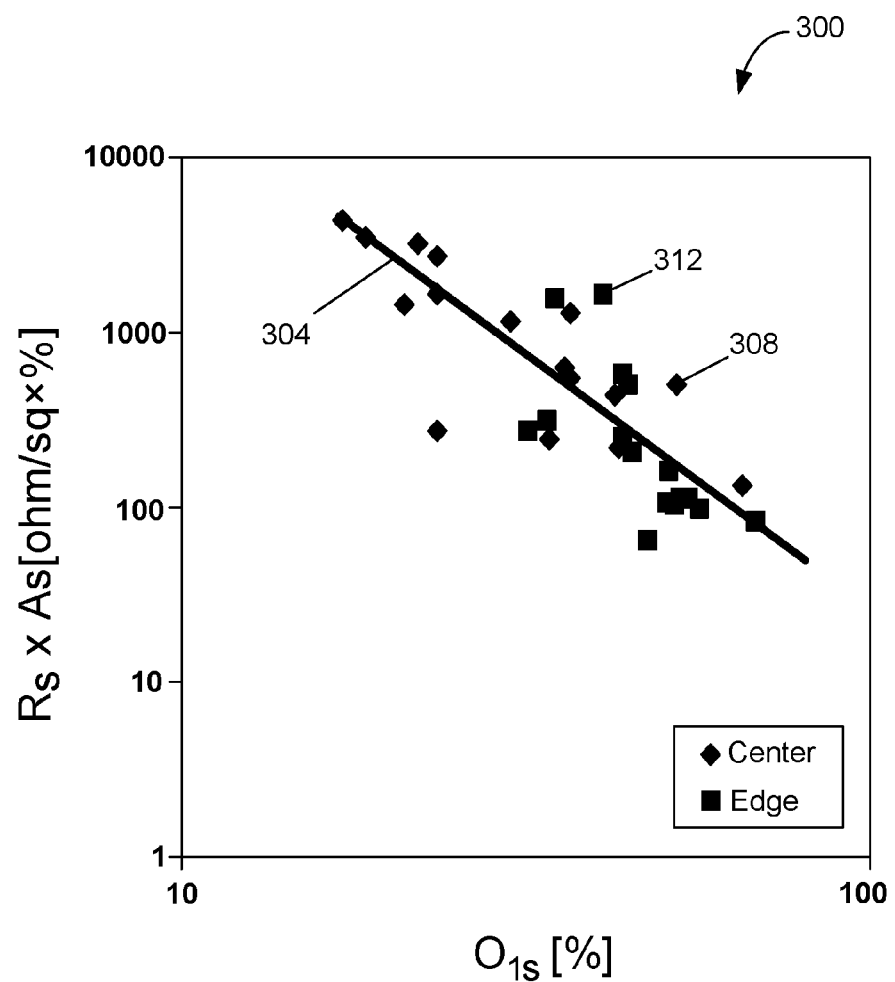
FIG. 3 is an exemplary graph of sheet resistance of doped arsenic versus oxygen dose, comparing the concentration rate at the substrate center and the substrate edge.

FIG. 3 is an exemplary graph 300 of sheet resistance of doped arsenic versus oxygen dose, comparing the concentration rate at the substrate center and the substrate edge. FIG. 3 shows a correlation between sheet resistance, $R_S$, and oxygen concentration rate in the wafer center designated by the diamond data points 308, and wafer edge designated by the square data points 312. $R_S$ is expressed as As[ohm/sq×%] in the Y-axis. The oxygen concentration rate on the Si surface is shown in the X-axis and was measured using X-ray photoelectron spectroscopy (XPS). The Si surface comprises silicon atoms, oxygen atoms, and arsenic atoms only. The inventors confirmed in their experiments that sheet resistance, $R_S$, decreased with increasing oxygen concentration, as shown in the slope of the curve 304. This phenomenon can be referred to as "oxidation enhanced diffusion" or OED and is a key inventive concept for solid source oxygen introduction used in the current invention.

Figure 4:
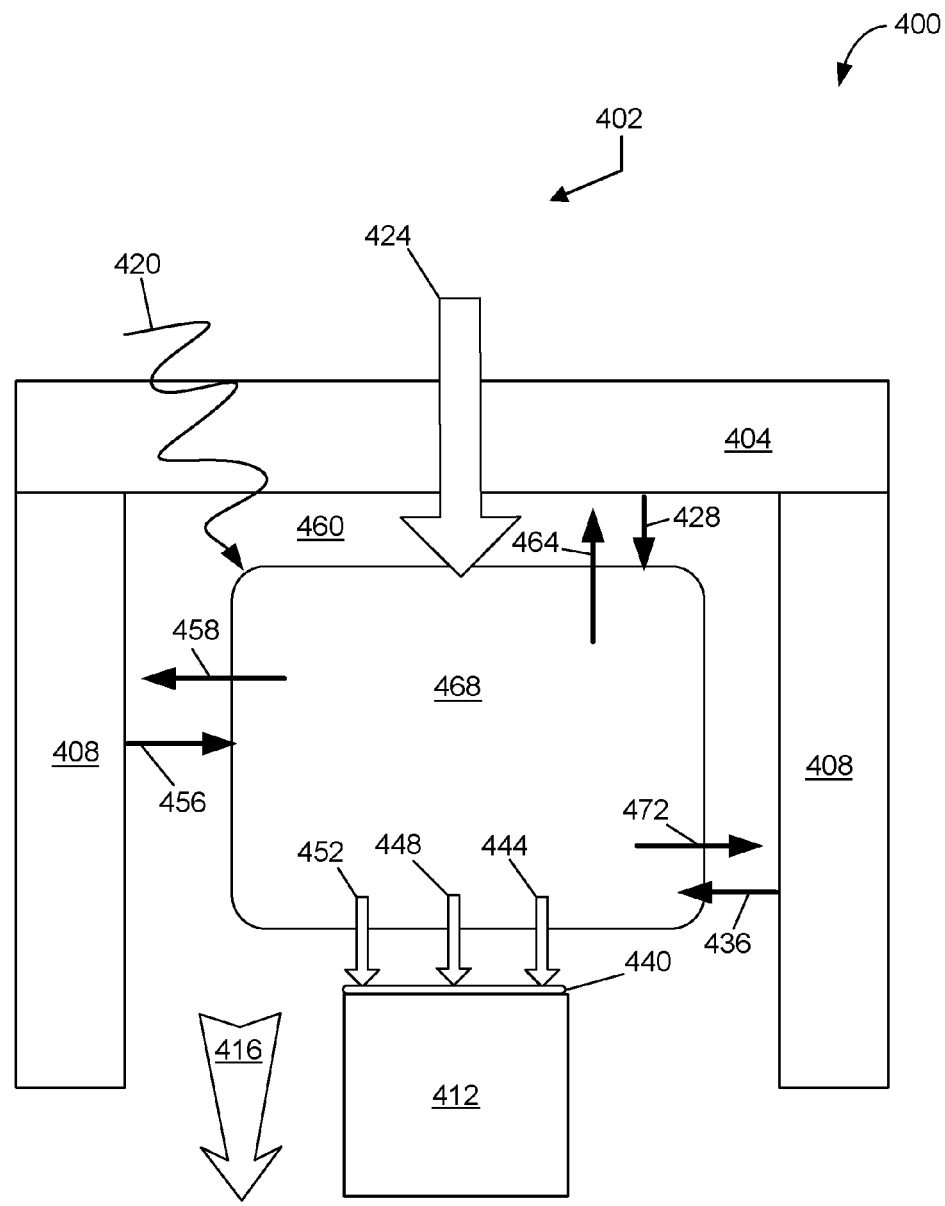
(FIG. 4 of R. Speidel and E. R. Weidlich, "A SOLID STATE OXYGEN SOURCE FOR UHV")

FIG. 4 is an exemplary architectural diagram 400 of a substrate processing system 402 comprising a quartz or alumina window 404 and walls 408 of a processing chamber in an embodiment of the present invention. The substrate processing system 402 comprises a processing chamber wall 408 and materials to control the delivery of dopant additives 452 (oxygen from the walls 456, 428, and 436) to the wafer 440, which resides on wafer stage 412. The substrate processing system 402 is configured to introduce a dopant-containing process gas 424 to chamber space 460, and further includes an exhaust system 416. A chamber configuration for plasma doping process depends on the type of plasma source used for dissociation of the process gas, the process gas including precursor and inert gas atoms. In one embodiment, the substrate processing system 402 employs a radial line slot array (RLSA) plasma source. Other plasma sources such as capacitive coupled plasmas (CCP) or inductive coupled plasma (ICP) can also be used. A power source 420 can supply power such as microwave introduced through an antenna and window from a waveguide (not shown), or radio frequency (RF) power. Other types of power sources can also be used. Generally, the oxygen-containing window 404 is alumina ($Al_2O_3$). Alternatively, quartz ($SiO_2$) and other similar materials can also be used. If quartz is used, the quartz window over plasma is etched by energetic plasma ions, (458, 464, and 472), oxygen atoms get out to the chamber space 460, from the inner quartz window. The sputtering rate is mainly controlled by power source 420 and the resulting ion flux, (458, 464, and 472), in order to control supplied amount of oxygen. The oxygen containing walls 408 can be constructed of alumina with an yttria coating. Other oxygen containing materials such as metal oxides can be used for the oxygen containing walls 408. Doping is effected by fluxes of oxygen 448, dopant 452 and ions 444.

Figure 5:
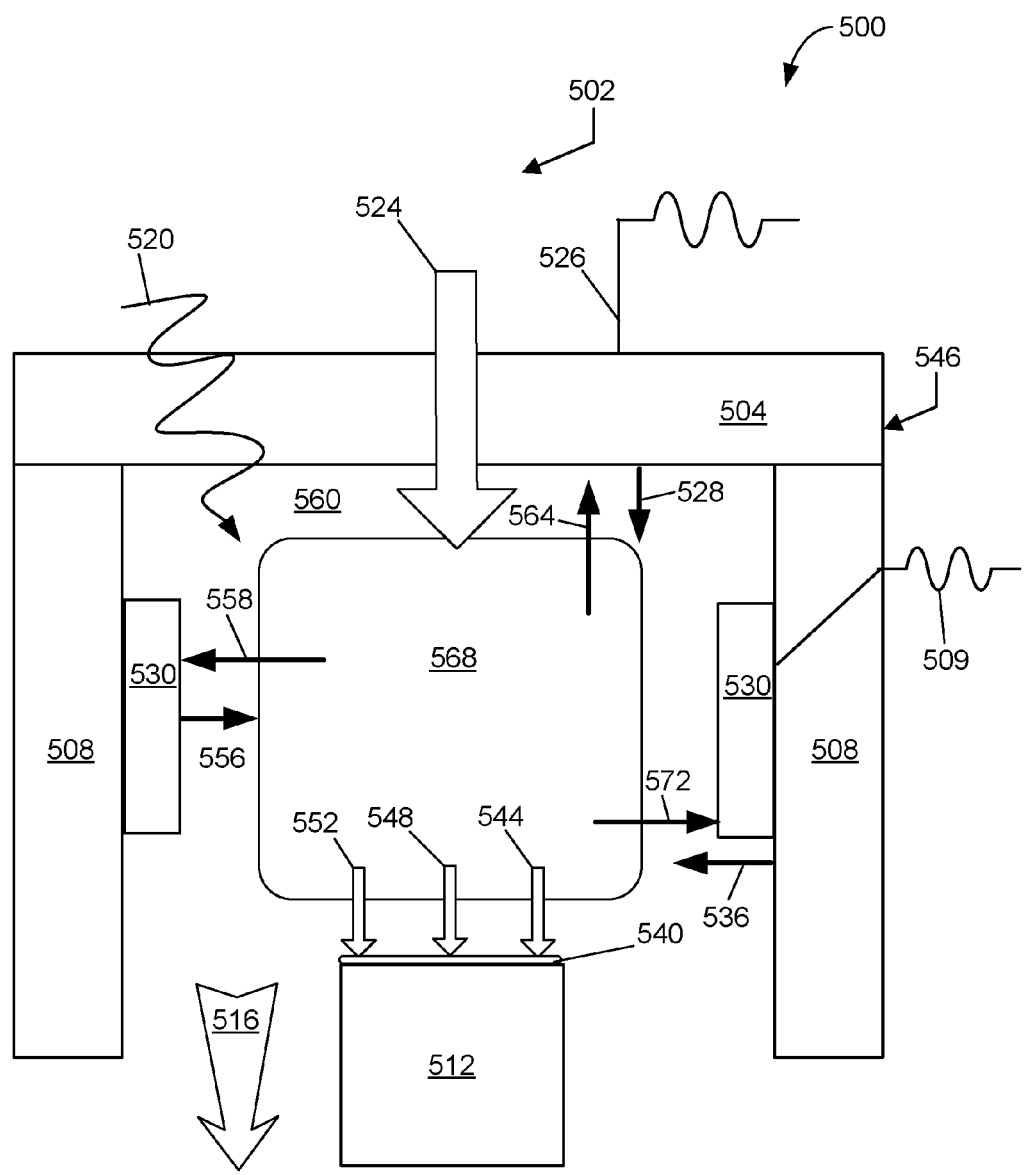
FIG. 5 is an exemplary architectural diagram of a quartz or alumina window and walls of a processing chamber in another embodiment of the present invention.

FIG. 5 is an exemplary architectural diagram 500 of a quartz or alumina window 504 and walls 508 of a processing chamber 546 in another embodiment of the present invention. The processing system 502 of FIG. 5 is similar to system 402 of FIG. 4 except for the addition of oxygen-containing material inside the processing chamber 546. In an exemplary embodiment, microwave power 520 is coupled through the window 504 along with a dopant-containing process gas 524 to generate a plasma in the interior space 560 of processing chamber 546 (which includes exhaust system 516). The oxygen-containing material 530 can be quartz or metal oxide, proximate or attached to one or more walls 508 of the processing chamber 546. In one embodiment, control of the introduction of oxygen into the processing chamber 546 is independent of controlling the microwave power 520 or wafer bias power (not shown). In another embodiment, pulsed biasing 526 of the quartz window 504 and/or pulsed biasing 509 of the one or more walls 508 with proximate or attached oxygen-containing material 530 are done to increase the yield of the ions (558, 564, and 572) on the window 504 and therefore control the flux of oxygen atoms (528, 536, and 556) to the plasma 568 and control the flux of oxygen atoms 552, the flux of dopant atoms 548, and flux of ions 544 to the substrate 540 on the wafer stage 512.

Figure 6:
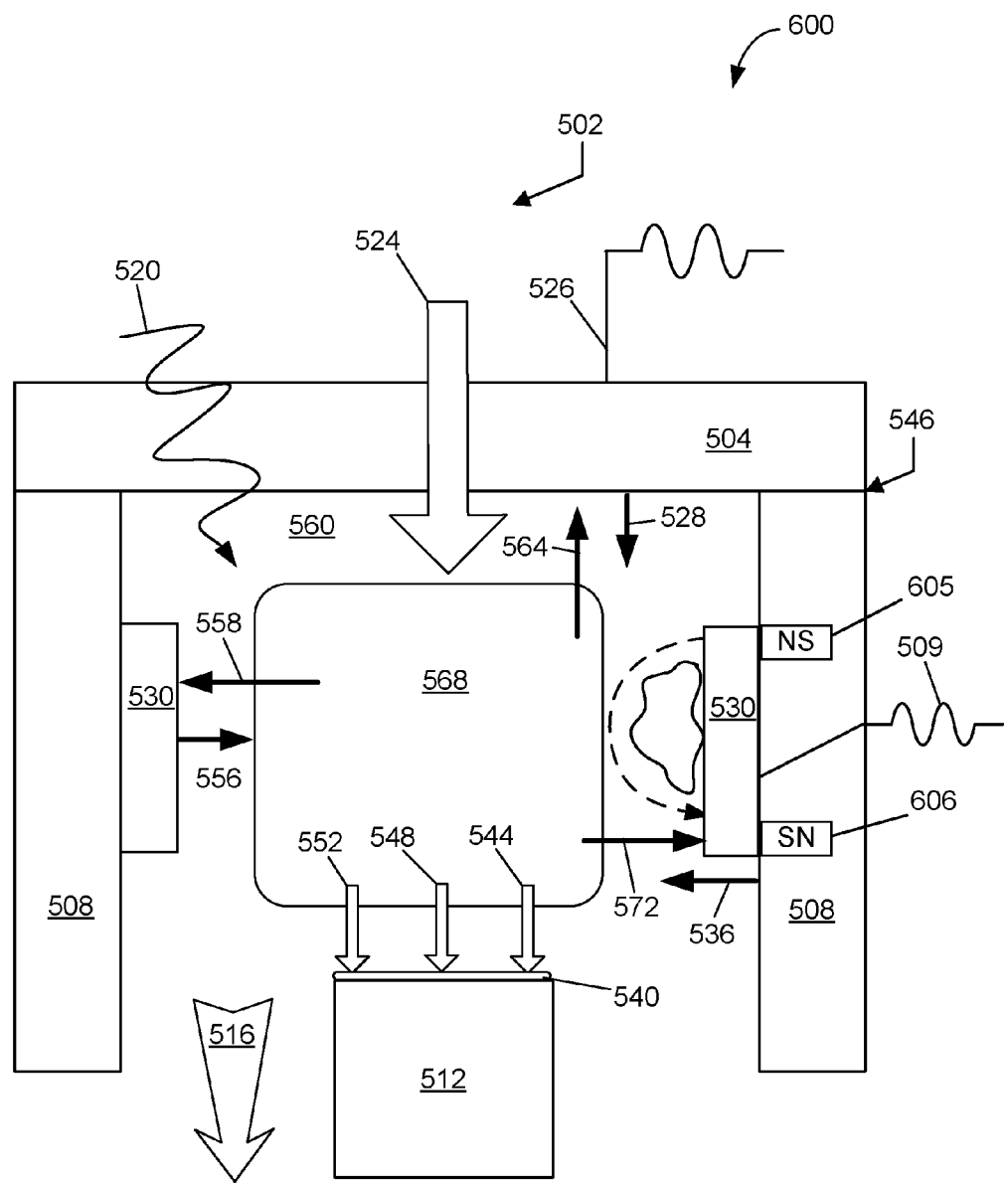
FIG. 6 is an exemplary architectural diagram of a magnetron source in a processing chamber in another embodiment of the present invention.

FIG. 6 is an exemplary architectural diagram 600 according to another embodiment of the present invention that includes the processing system 502 identical to that of FIG. 5 except for the addition of a magnetron source in the processing chamber 546. As is the case for deposition of dielectric materials such as metal nitrides from a surface, magnetrons, 605 and 606, comprising a magnet with a north-south polarity 605 and another magnet with a south-north polarity 606, are configured to enhance the erosion rate and therefore oxygen injection rate into the plasma 568 and onto the substrate 540. The magnetrons, 605 and 606, may be placed at different partrs of the processing chamber 546 to provide the processing chamber 546 with some level of spatial control of oxygen impinging on the surface of the substrate 540. Other surfaces may also provide beneficial oxygen into the processing chamber 546. As mentioned above, the one or more oxygen-containing chamber walls 508 can comprise alumina with yttria coating. In addition, the one or more oxygen-containing quartz plates 530 can be installed around the wafer stage 512 or around the one or more chamber walls 508 that could be preferentially eroded. In the doping process, the one or more plates 530 are etched by energetic ions from the sheath and oxygen atoms are provided into the chamber space 560; similarly, the window 504 is etched by energetic ions from the sheath and oxygen atoms are provided into the chamber space 560. RF bias power 509 can be applied to the oxygen-containing quartz plate 530 different from the substrate stage's system power source. The sputtering rate of oxygen into the chamber space 560 is controlled using the power source, such as the microwave power source 520 and the RF bias power sources 509 and 526.

Figure 7:
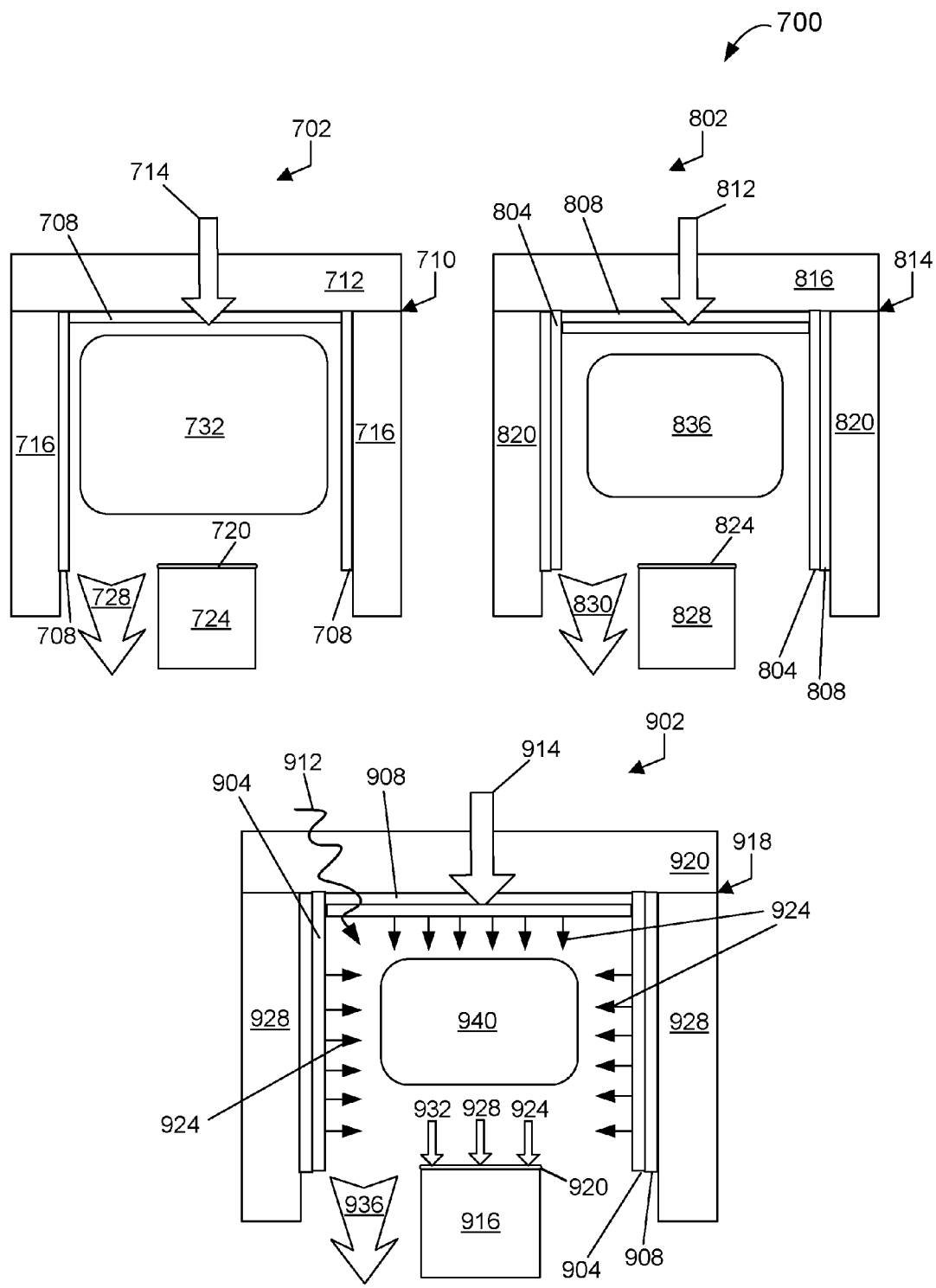
FIG. 7 is an exemplary architectural diagram of a radio frequency (RF) biased magnetron in a processing chamber in another embodiment of the present invention.

FIG. 7 is an exemplary architectural diagram 700 of process modules in an embodiment of the present invention including a deposition/silicon plasma module 702, an oxidation plasma module 802, and a doping plasma module 902. The deposition/silicon plasma module 702 is configured to introduce silane or other precursor gas 714 into the processing chamber 710 and create a silicon deposition plasma 732. The processing chamber 710 includes a window 712 made with an oxygen-containing material such as alumina or quartz and one or more walls 716 made of oxygen-containing material. Moreover, the processing chamber 710 includes a substrate 720 positioned on a stage 724 and an exhaust system 728. The silicon deposition plasma 732 deposits a silicon film 708 on the window 712 and on one or more walls 716 of the processing chamber 710.

FIG. 7 further includes an oxidation plasma module 802 configured to introduce an oxide layer using an oxygen gas from the process gas or other precursor gas 812 into the processing chamber 814 and create an oxidation plasma 836. The processing chamber 814 includes a window 816 made with an oxygen-containing material such as alumina or quartz and one or more walls 820 made of oxygen-containing material. Moreover, the processing chamber 814 includes a substrate 824 positioned on a stage 828 and an exhaust system 830. The oxidation plasma 836 deposits an oxide layer 804 on the inside of the window 816 and on one or more walls 820 over the Si film 808 layer.

FIG. 7 further includes a doping plasma module 902 configured to introduce a doping gas mixture 914 into the processing chamber 918 and creation of a doping plasma 940 as a result of energy applied from the power source 912. The power source 912 can be a microwave, RF, direct or alternating current power sources. The processing chamber 918 includes a window 920 made with an oxygen-containing material such as alumina or quartz and one or more walls 928 made of oxygen-containing material. Moreover, the processing chamber 918 includes a substrate 920 positioned on a stage 916 and an exhaust system 936. The doping plasma 940 exposes a portion of a surface of the substrate 920 positioned on the stage 916 to oxygen flux 924 from the oxide layer 904 deposited over the silicon film 908 where the oxide layer 904 and the silicon film 908 are coated on the inside of the window 920 and on the one or more walls 928 using the process modules such as the deposition/silicon plasma module 702 and the oxidation plasma module 902 described above. The processing chamber 918 also includes an exhaust system 936 that causes the flow of the combined dopant 932, ions 928, and combined oxygen and silicon 924 gases to expose a portion of a surface of the substrate 920 positioned on the stage 916. The same processing module can be used for the deposition/silicon plasma module 702, the oxidation plasma module 802, and the doping plasma module 902. Uniformity in substrate surface of supplied amount of oxygen 924 can be controlled by a control system discussed in detail in connection with FIG. 11. Furthermore, sheet resistance uniformity in the substrate layer can be controlled with the same control system. Optical emission spectroscopy or monitoring of the plasma impedance are methods by which the oxygen 924 content relative to dopant 932 amount can be controlled using the aforementioned control system.

Figure 8:
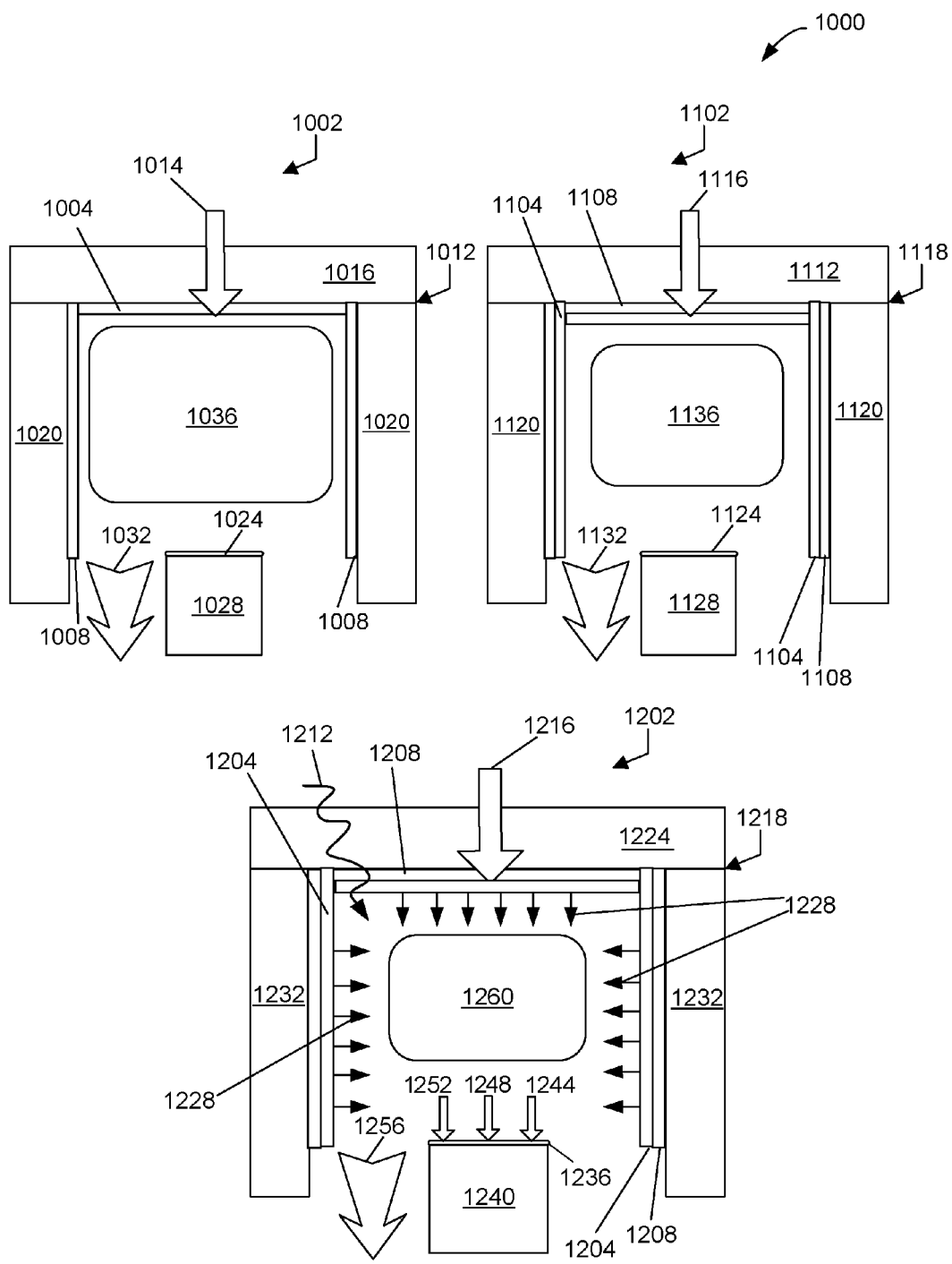
FIG. 8 is an exemplary architectural diagram of a pre-deposition strategies in a processing chamber prior the doping process in another embodiment of the present invention.

FIG. 8 is an exemplary architectural diagram 1000 of process modules in an embodiment of the present invention including a deposition/silicon plasma module 1002, a dopant deposition plasma module 1102, and a doping plasma module 1202. The deposition/silicon plasma module 1002 is configured to introduce silane or other precursor gas 1014 into the processing chamber 1012 and create a silicon deposition plasma 1036. The processing chamber 1012 includes a window 1016 made with an oxygen-containing material such as alumina or quartz and one or more walls 1020 made of oxygen-containing material. Moreover, the processing chamber 1012 includes a substrate 1024 positioned on a stage 1028 and an exhaust system 1032. The silicon deposition plasma 1036 deposits a silicon film 1008 on the inside surface of the window 1016 and on one or more walls 1020 of the processing chamber 1012.

FIG. 8 further includes a dopant deposition plasma module 1102 configured to introduce a dopant deposition layer using phosphine or other precursor gas 1116 into the processing chamber 1118 and create a dopant plasma 1136. The processing chamber 1118 includes a window 1112 made with an oxygen-containing material such as alumina or quartz and one or more walls 1120 made of oxygen-containing material. Moreover, the processing chamber 1118 includes a substrate 1124 positioned on a stage 1128 and an exhaust system 1132. The dopant plasma 1136 deposits a dopant deposition layer 1104 on the inside of the window 1112 and on the inside of the one or more walls 1120, the dopant deposition layer 1104 placed on top of the Si film 1108 layer.

FIG. 8 further includes a doping plasma module 1202 configured to introduce a doping gas mixture 1216 into the processing chamber 1218 and creation of a doping plasma 1260 as a result of energy applied from the power source 1212. The power source 1212 can be a microwave, RF, direct or alternating current power sources. The processing chamber 1218 includes a window 1224 made with an oxygen-containing material such as alumina or quartz and one or more walls 1232 made of oxygen-containing material. Moreover, the processing chamber 1218 includes a substrate 1236 positioned on a stage 1240 and an exhaust system 1256. The doping plasma 1260 exposes a portion of a surface of the substrate 1236 positioned on a stage 1240 to dopant flux 1228 from the dopant deposition layer 1204 deposited over the silicon film 1208 where the dopant deposition layer 1204 and the silicon film 1208 are coated on the inside of the window 1224 and on the inside of the one or more walls 1232 using process modules such as the deposition/silicon plasma module 1002 and the dopant deposition plasma module 1102 described above.

The processing chamber 1218 of the doping plasma module 1202 also includes an exhaust system 1256 that causes the flow of the combined dopant 1252, ions 1248, and combined dopant and silicon 1244 gases to expose a portion of a surface of the substrate 1236 positioned on the stage 1240. The deposition/silicon plasma module 1002, the dopant deposition plasma module 1102, and the doping plasma module 1202 can be the same or different processing modules. Uniformity of supplied amount of dopant 1244 in the substrate surface can be controlled by a control system discussed in detail in connection with FIG. 11. Furthermore, sheet resistance uniformity in the substrate layer can be controlled with the same control system. Optical emission spectroscopy (OES) or monitoring of the plasma impedance are methods by which the dopant 1244 content relative to dopant 1252 amount can be controlled using the aforementioned control system.

Variations of the setup above can be exercised. For example, in an embodiment, phosphorus may be introduced into the processing chamber 1218 in a metered manner by sputtering a thin pre-deposited phosphorus film instead of silicon film. In this case oxygen could be introduced from the gas stream or from another pre-deposited oxide layer. In another embodiment, sublimed dopant oxides can be delivered to the chamber through heated gas lines, since dopant oxides are volatile and sublime at relatively low temperatures.

In yet another embodiment, the oxides may be introduced into a heated crucible and carried to the chamber using a heated gas line. The amount of oxygen and dopant may be effectively metered by fast mass flow controllers (MFC's) upstream of the processing chamber 1218 or by introducing only the desired amount of dopant and oxide into the crucible.

As mentioned above, introduction of oxygen into the processing chamber can be accomplished by other methods. For example, laser ablation (or other kind of ablation) of an oxide material in the processing chamber can be used to deliver specific amounts of oxygen. The oxygen could be introduced into the processing chamber prior to a process step and deposited on a cooled surface or "coldfinger" on which the oxygen would be condensed. Flash heating or ablating the surface would liberate the oxygen and deliver a metered amount into the plasma. A similar process can also be used for introducing phosphorus from pre-deposited surfaces into the plasma and onto a substrate. Ablation may be replaced by plasma based removal of oxygen such as ion removal on cold surfaces for example. Adding pre-dissociated O ions or radicals to the processing chamber instead of oxygen so that negative oxygen ions are not formed. Oxygen atoms on their own do not readily produce negative oxygen ions.

Figure 9:
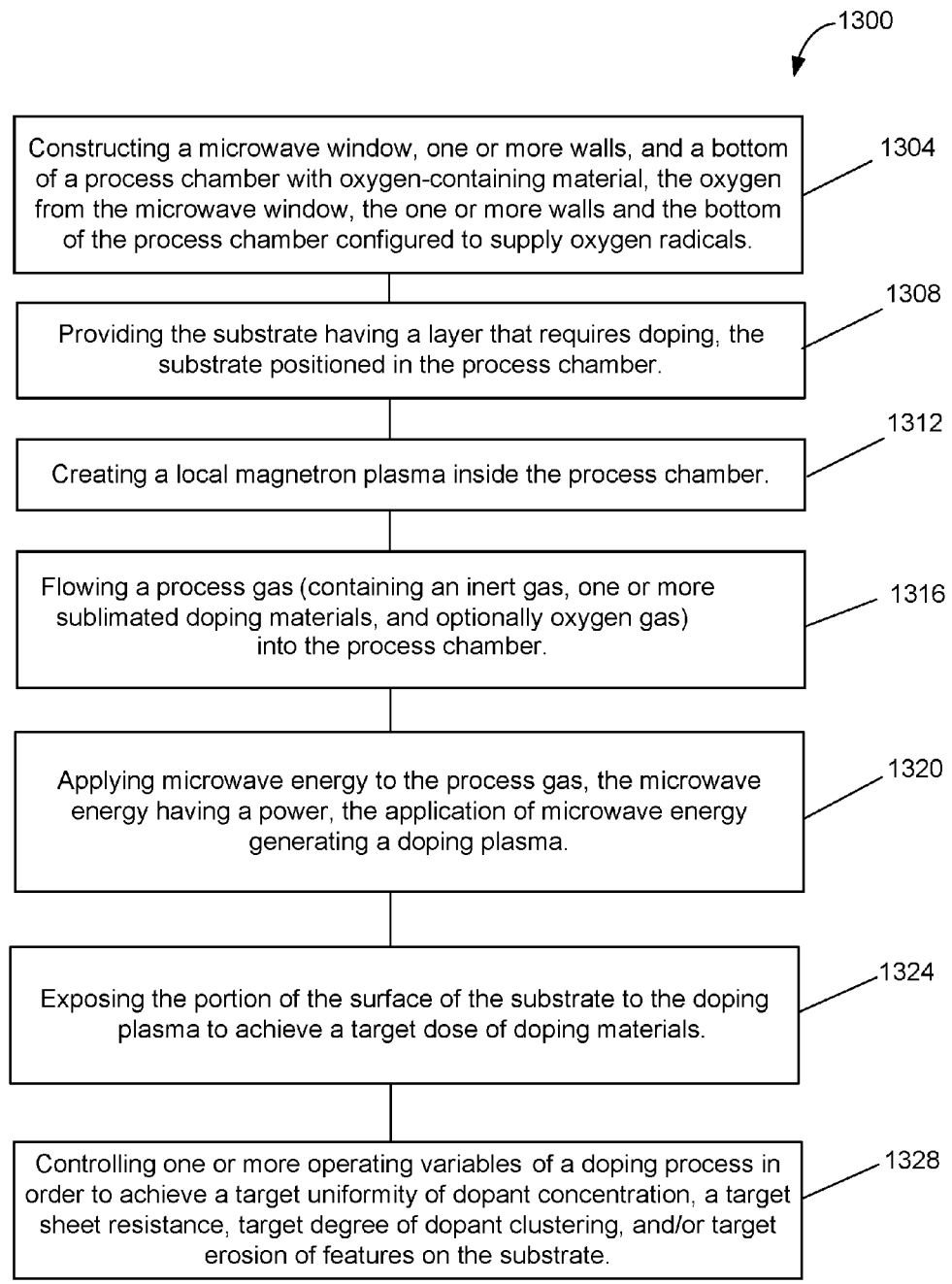
FIG. 9 is an exemplary flow chart of a method using a plasma doping system in an embodiment of the present invention.

FIG. 9 is an exemplary flow chart 1300 of a method using a plasma doping system in an embodiment of the present invention. In operation 1304, the method of doping a portion of a non-planar surface and/or a surface of a substrate subject to one or more poor view factors comprises constructing a microwave window, one or more walls, and a bottom of a processing chamber with oxygen-containing material, the oxygen from the microwave window, the one or more walls and the bottom of the processing chamber configured to supply oxygen radicals as an additive to one or more doping materials. Non-planar surface and/or a surface of a substrate subject to one or more poor view factors include silicon nanowires, features with high aspect ratios, Fin-Shaped Field Effect Transistor (FINFET) structures, vertical memory devices, and the like. The microwave window can be alumina or quartz and the one or more walls can include metal oxides. In operation 1308, a substrate having a layer that requires doping is positioned in the processing chamber. In operation 1312, a local magnetron plasma is created inside the processing chamber by placing magnets proximate to a wall of the processing chamber or around the substrate stage. In operation 1316, a process gas is introduced into the processing chamber, wherein the process gas contains an inert gas and one or more sublimated doping materials, and optionally oxygen gas. In one embodiment, oxygen dose is correlated to the sheet resistance of the layer of the substrate, where the correlation is used to control the one or more operating variables (or parameters) of the doping process to achieve the target sheet resistance. In another embodiment, the process gas does not contain oxygen and all the oxygen used in the process is provided by solid sources of oxygen.

In operation 1320, energy is applied to the process gas, the energy having a power, the application of microwave generating a doping plasma. In operation 1324, a portion of the surface of the substrate is exposed to the doping plasma, to achieve a target dose of doping materials in the portion of the surface of the substrate. In operation 1328, one or more operating variables (or parameters) of the doping process is controlled in order to achieve one or more doping process objectives, namely, one or more of a target uniformity of dopant concentration, a target sheet resistance, target degree of dopant clustering, and/or target erosion of features on the substrate. For example, the target uniformity of the dopant concentration can be less than 3% across the wafer, such as less than 1%. The target sheet resistance can be in a range from 200 to 400 ohms per square, such as 300 ohms. The target degree of dopant clustering is expressed as a target dopant to oxygen ratio prior to an anneal process, and the target dopant to oxygen ratio can be in a range from 0.1% or less. The target erosion can be in a range of from 1 nm corner loss or less. The depth of the dosing materials (junction depth) can be in a range from 2 nm to 10 nm, such as 3 nm. The target dose can be in the range of from $10^{12}$ cm$^{-2}$ to $10^{16}$ cm$^{-2}$, or can be below a saturation limit of the substrate, or less than 5 atomic percent.

Figure 10:
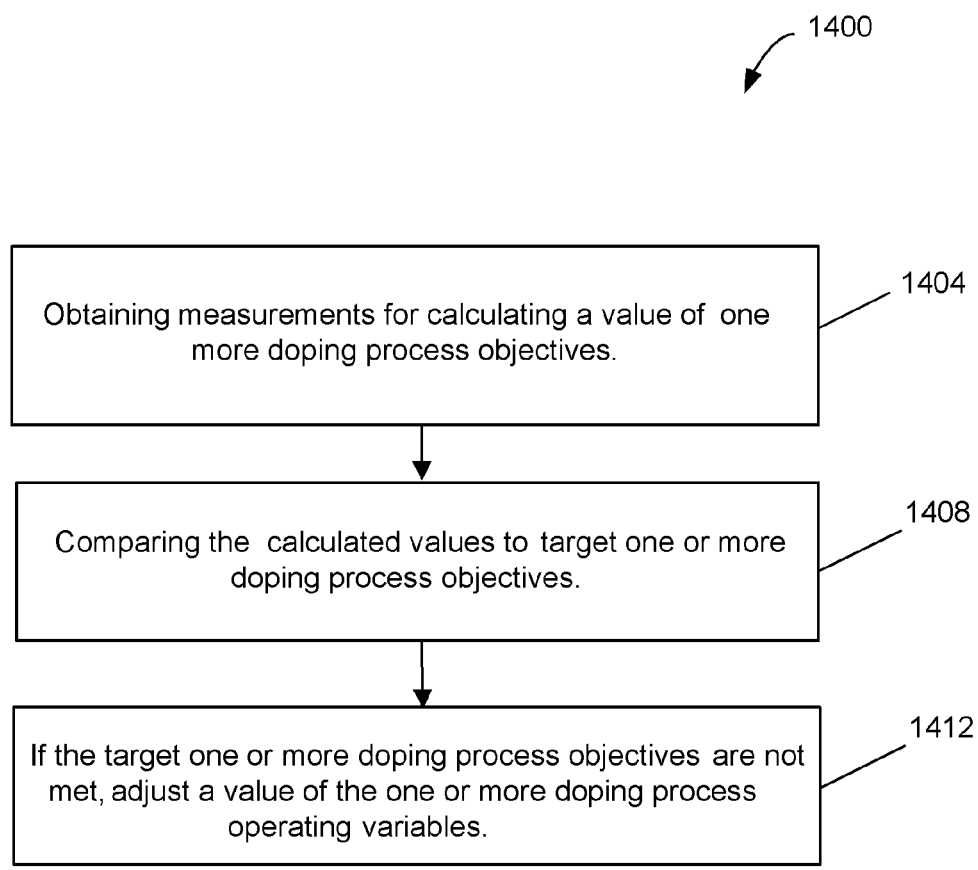
FIG. 10 is an exemplary flow chart of a method steps for controlling the plasma doping system in an embodiment of the present invention.

FIG. 10 is an exemplary flow chart 1400 of method steps for controlling the plasma doping system in an embodiment of the present invention. In operation 1404, measurements for calculating a value of one more doping process objectives are obtained. In operation 1408, the calculated values are compared to the target one or more doping process objectives. In operation 1412, if the target doping process objectives are not met, a value of one or more doping process operating variables is adjusted. The one or more doping process operating variables can include type of power source, power applied to the processing chamber, type of dopant, concentration of dopant, partial pressure of oxygen, total pressure of process gases, flow rate of process gases, vacuuming rate, dopant to oxygen ratio, junction depth, doping dose, and substrate temperature.

Figure 11:
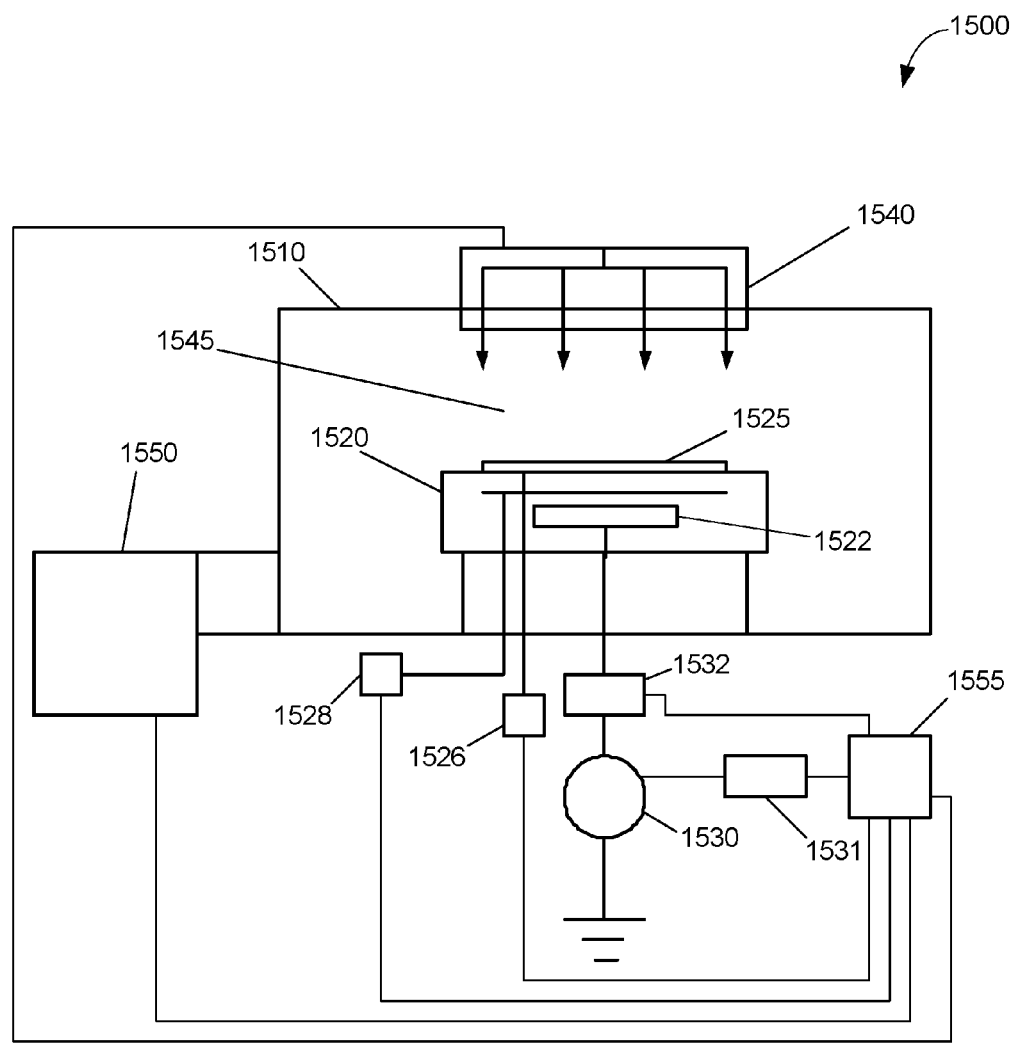
FIG. 11 is an exemplary simplified schematic of a control system used in process sequences of a plasma doping process utilizing solid state source introduction of dopants and additives in an embodiment of the present invention.

FIG. 11 is an exemplary simplified schematic of a plasma doping system 1500 used in process sequences of a controlled plasma doping process utilizing solid state source introduction of dopants and additives in an embodiment of the present invention. A plasma doping system 1500 configured to perform the above identified process conditions is depicted in FIG. 11 comprising a plasma processing chamber 1510, substrate holder 1520, upon which a substrate 1525 to be processed is affixed, and vacuum pumping system 1550. Substrate 1525 can be a semiconductor substrate, a wafer, a flat panel display, or a liquid crystal display. Plasma processing chamber 1510 can be configured to facilitate the generation of plasma in plasma processing region 1545 in the vicinity of a surface of substrate 1525. An ionizable gas or mixture of process gases is introduced via a gas distribution system 1540. For a given flow of process gas, the process pressure is adjusted using the vacuum pumping system 1550. Plasma can be utilized to create materials specific to a pre-determined materials process, and/or to aid the removal of material from the exposed surfaces of substrate 1525. The plasma processing system 1500 can be configured to process substrates of any desired size, such as 200 mm substrates, 300 mm substrates, or larger.

Substrate 1525 can be affixed to the substrate holder 1520 via a clamping system 1528, such as a mechanical clamping system or an electrical clamping system (e.g., an electrostatic clamping system). Furthermore, substrate holder 1520 can include a heating system (not shown) or a cooling system (not shown) that is configured to adjust and/or control the temperature of substrate holder 1520 and substrate 1525. The heating system or cooling system may comprise a re-circulating flow of heat transfer fluid that receives heat from substrate holder 1520 and transfers heat to a heat exchanger system (not shown) when cooling, or transfers heat from the heat exchanger system to substrate holder 1520 when heating. In other embodiments, heating/cooling elements, such as resistive heating elements, or thermo-electric heaters/coolers can be included in the substrate holder 1520, as well as the chamber wall of the plasma processing chamber 1510 and any other component within the plasma doping system 1500. It was found during a set of tests that a target doping dose after an anneal process is obtained using helium or argon as the inert gas and when a vacuum or exhaust pump coupled to the processing chamber is turned on.

Additionally, a heat transfer gas can be delivered to the backside of substrate 1525 via a backside gas supply system 1526 in order to improve the gas-gap thermal conductance between substrate 1525 and substrate holder 1520. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 1525.

In an embodiment, substrate holder 1520 can comprise an electrode 1522 through which RF power is coupled to the processing plasma in plasma processing region 1545. For example, substrate holder 1520 can be electrically biased at a RF voltage via the transmission of RF power from a RF generator 1530 through an optional impedance match network 1532 to substrate holder 1520. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Furthermore, the electrical bias of electrode 1522 at a RF voltage may be pulsed using pulsed bias signal controller 1531. The RF power output from the RF generator 1530 may be pulsed between an off-state and an on-state, for example. Alternately, RF power is applied to the substrate holder electrode at multiple frequencies. Furthermore, impedance match network 1532 can improve the transfer of RF power to plasma in plasma processing chamber 1510 by reducing the reflected power. Match network topologies (e.g. L-type, π-type, T-type, etc.) and automatic control methods are well known to those skilled in the art.

Gas distribution system 1540 may comprise a showerhead design for introducing a mixture of process gases. Alternatively, gas distribution system 1540 may comprise a multi-zone showerhead design for introducing a mixture of process gases and adjusting the distribution of the mixture of process gases above substrate 1525. For example, the multi-zone showerhead design may be configured to adjust the process gas flow or composition to a substantially peripheral region above substrate 1525 relative to the amount of process gas flow or composition to a substantially central region above substrate 1525.

Vacuum pumping system 1550 can include a turbo-molecular vacuum pump (TMP) capable of a pumping speed up to about 8000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 1510.

As mentioned above, the controller 1555 can comprise a microprocessor, memory, and a digital I/O port capable of generating control voltages sufficient to communicate and activate inputs to plasma processing system 1500 as well as monitor outputs from plasma processing system 1500. Moreover, controller 1555 can be coupled to and can exchange information with RF generator 1530, pulsed bias signal controller 1531, impedance match network 1532, the gas distribution system 1540, vacuum pumping system 1550, as well as the substrate heating/cooling system (not shown), the backside gas supply system 1526, and/or the electrostatic clamping system 1528. For example, a program stored in the memory can be utilized to activate the inputs to the aforementioned components of plasma processing system 1500 according to a process recipe in order to perform a plasma assisted process, such as a plasma etch process, on substrate 1525.

Figure 12A:
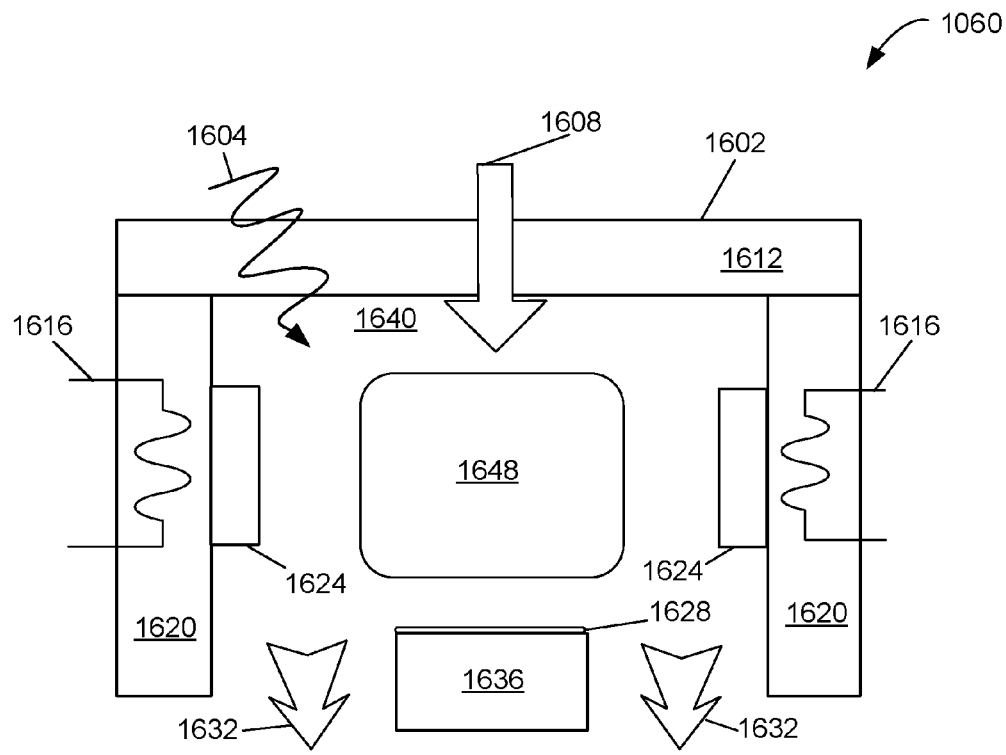
FIG. 12A is an exemplary architectural diagram of a chilled surface and condensed oxygen or oxygen containing materials and oxygen gas in a doping plasma module whereas FIG. 12B an exemplary architectural diagram of pre-dissociated oxygen atoms in a doping plasma module in another embodiment of the present invention.

FIG. 12A is an exemplary architectural diagram 1600 of a chilled surface or condensed oxygen or oxygen-containing materials 1624 and oxygen gas in a doping plasma module in another embodiment of the present invention. The diagram 1600 comprises a processing chamber 1602 configured with a window 1612 made with an oxygen-containing material, which can include pulsed biasing 1604, and one or more walls 1620 also made with an oxygen-containing material, a substrate 1628 positioned on a stage 1636, and exhaust system 1632. The one or more walls 1620 include cooling devices 1616 configured to maintain a certain low temperature for oxygen-containing materials or condensed oxygen 1624 coupled to the inside wall of the processing chamber 1602. The oxygen gas 1608 can be introduced into the chamber space 1640 of processing chamber 1602 during a prior process step and deposited on a chilled surface or "cold-finger" on which the oxygen would be condensed. Flash heating or ablating the surface would liberate the oxygen and deliver a metered amount into the plasma 1648. Laser ablation (or other kind of ablation) of an oxide material in the chamber can be used to deliver specific amounts of O into the processing chamber 1602. A similar procedure can also be used for the introduction of phosphorus from pre-deposited surfaces (not shown) into the plasma 1648 and onto the substrate 1628.

Figure 12B:
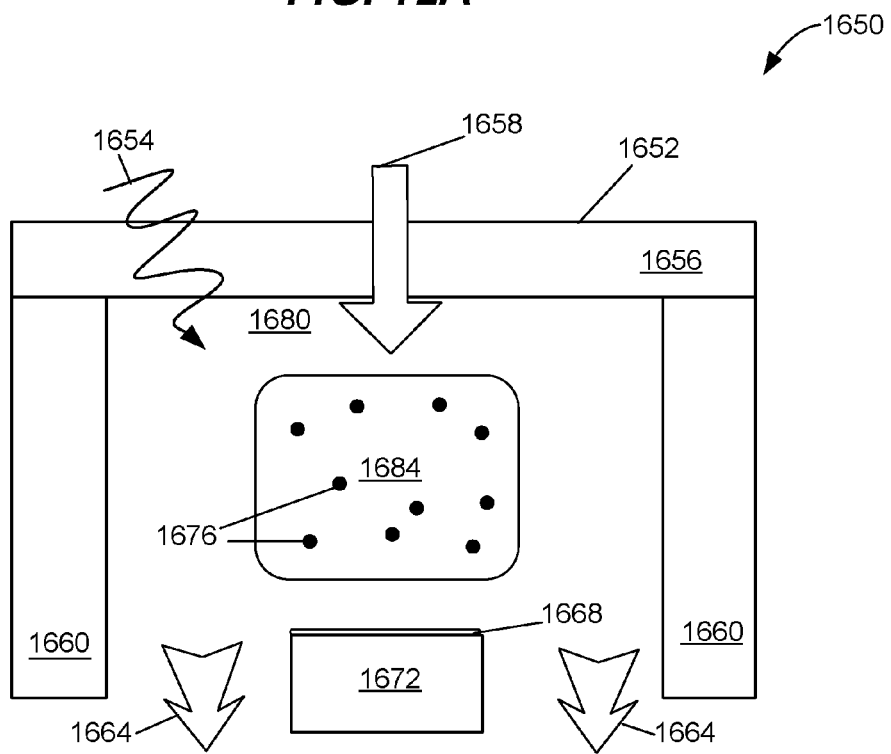

FIG. 12B an exemplary architectural diagram 1650 of pre-dissociated oxygen atoms in a doping plasma module in another embodiment of the present invention. The diagram 1650 comprises a processing chamber 1652 configured with a window 1656 made with an oxygen-containing material, which can include pulsed biasing 1654, and one or more walls 1660 also made with an oxygen-containing material, a substrate 1668 positioned on a stage 1672, and exhaust system 1664. In this embodiment, pre-dissociated oxygen atoms and ions 1676 are added via process stream 1658 into the doping plasma 1684 in the chamber space 1680 using an up-stream microwave source or ultra-violet (UV) source device capable of generating the oxygen atoms and ions 1676; such devices are well known in the art.

There are numerous solid state oxygen sources that release oxygen either through liberation from thermally unstable oxides (Speidel and Weidlich, "A SOLID STATE OXYGEN SOURCE FOR UHV", Vacuum, 38, 89-92 (1988)) or through exothermic chemical reactions. The chemical reaction variety are, for example, so-called oxygen candles in which an oxide containing material (sodium chlorate) is intimate with iron powder and liberates oxygen when heated. Oxygen candles are well known as oxygen sources for air or spacecraft. (Refer to patents attributed to Avox Corp. U.S. Pat. Nos. 4,891,118 and 4,536,370). The inventors found that oxygen candles can be activated by flash heating or by exposure to pulsed laser energy where metered amounts of oxygen can be delivered using this mechanism. Solid state sources of oxygen are employed instead of oxygen gas in order for oxidation enhanced diffusion to occur. Some general ways to achieving low sheet resistance include increasing of flow rate of process gas including dopant, and increasing of RF bias power on wafer stage, etc.

The embodiments of the present invention described above in relation to the figures highlight one or more methods that include one or more of the following techniques mentioned above: (1) oxygen delivered to the process by sputtering oxide containing surfaces, (b) active sputtering of surfaces by RF or pulsing energy source, (c) two or more different surfaces used include sputtering of inserted surfaces, (d) magnetron plasmas can be used to locally enhance the rate of oxygen removal at specific locations, (e) an oxide surface can be pre-deposited in an oxidation step or by condensation onto cold surfaces, (f) control by using optical emission spectroscopy (OES) or impedance monitoring, (g) pre-addition of oxygen to the processing chamber and introduction to the process by desorption which naturally occurs in-situ, (h) delivery of sublimated dopant oxides through heated gas streams into the processing chamber, and (i) delivery of oxygen from solid oxygen sources such as decomposed metal oxides or oxygen candles.

Other embodiments include the flowing of oxygen into the processing chamber, delivery of sublimated doping materials, and examples of commonly used oxygen containing materials. In an embodiment, oxygen is flowed into the processing chamber prior to flowing the process gas and prior to applying the microwave energy to the process gas and wherein the oxygen is cooled into solid oxygen by a helium cooling system. In another embodiment, the process gas containing oxygen can initially be flowed into the process chamber in order to saturate interior surfaces of the process chamber with oxygen, this process being performed prior to applying microwave energy to the process gas and exposing the portion of the surface of the substrate to the doping plasma. In still another embodiment, sublimated doping materials are delivered to the processing chamber using heated gas lines in order to maintain the desired temperature. In yet another embodiment, the oxygen-containing material can comprise copper oxide and/or zirconium oxide.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method of doping a portion of a surface of a substrate, the surface being non-planar and/or subject to one or more poor view factors, the method comprising:
    constructing a microwave window, one or more walls, and a bottom of a process chamber with an oxygen-containing material, wherein the oxygen from the microwave window, the one or more walls and the bottom of the process chamber is configured to supply oxygen radicals as additives to one or more doping materials;
    providing the substrate having a layer that requires doping, the substrate positioned in the process chamber;
    placing one or more quartz pieces inside the process chamber;
    placing one or more magnets proximate to the process chamber, the one or more magnets and the one or more quartz pieces configured to create a local magnetron plasma inside the process chamber;
    flowing a process gas into the process chamber, wherein the process gas contains an inert gas and one or more sublimated doping materials, and optionally oxygen gas;
    applying microwave energy to the process gas, the microwave energy having a power, the application of microwave energy generating a doping plasma;
    exposing the portion of the surface of the substrate to the doping plasma to achieve a target dose of doping materials in the portion of the surface; and
    controlling one or more operating variables of a doping process in order to achieve a target uniformity of dopant concentration, a target sheet resistance, target degree of dopant clustering, and target erosion of features on the substrate.

2. The method of claim 1 further comprising forming a thin oxide layer on at least one interior surface of the process chamber.

3. The method of claim 2 further comprising forming a thin phosphorus film on at least one interior surface of the process chamber.

4. The method of claim 1 wherein the substrate with the non-planar surface or surface subject to poor view factors includes silicon nanowires, features with high aspect ratios, fin-shaped field effect transistor (FINFET) structures, or vertical memory devices.

5. The method of claim 1 wherein the target uniformity of dopant concentration is less than 3% across the wafer.

6. The method of claim 1 wherein the target sheet resistance is a range from 200 to 400 ohms per square.

7. The method of claim 1 wherein the target degree of dopant clustering is expressed as a target dopant to oxygen ratio prior to an anneal process, the target dopant to oxygen ratio ranging from 0.1% or less.

8. The method of claim 1 wherein the target erosion is a range of from 1 nm corner loss or less.

9. The method of claim 1 wherein a depth of the doping materials is in a range from 2 nm to 10 nm, and wherein the target dose is selected from: in the range of from $10^{12}$ cm$^{-2}$ to $10^{16}$ cm$^{-2}$, below a saturation limit of the substrate, or less than 5 atomic percent.

10. The method of claim 1 wherein the target dose after the anneal process is obtained using helium or argon as the inert gas and when a vacuum pump coupled to the process chamber is turned on.

11. The method of claim 1 wherein the doping plasma is delivered from a radial line slot array (RLSA) plasma source.

12. The method of claim 1 wherein a sputtering rate of energetic plasma ions of the doping plasma is controlled by varying the power of the microwave power source.

13. The method of claim 1 wherein oxygen dose is correlated to the sheet resistance of the layer of the substrate, the correlation used to control the one or more operating variables of the doping process to achieve the target sheet resistance.

14. The method claim 1 wherein the flowed process gas does not include oxygen.

15. The method of claim 1 wherein pulsed biasing of the window of the process chamber is performed to control flux of the oxygen radicals to the doping plasma, the oxygen radicals generated from the microwave window, one or more wall, and/or the bottom of the process chamber or from the one or more quartz pieces in the process chamber.

16. The method of claim 1 where concentration of oxygen in the surface of the substrate is controlled with measurements using optical emission spectroscopy or a plasma impedance monitor.

17. The method of claim 1 wherein oxygen is flowed into the process chamber prior to flowing the process gas and prior to applying the microwave energy to the process gas and wherein the oxygen is cooled into solid oxygen by a helium cooling system.

18. The method of claim 1 wherein oxygen is initially flowed into the process chamber to saturate interior surfaces of the process chamber with the oxygen prior to flowing the process gas, applying microwave energy to the process gas and exposing the portion of the surface of the substrate to the doping plasma.

19. The method of claim 1 wherein the one or more sublimated doping materials are delivered to the process chamber using heated gas lines.

20. The method of claim 1 wherein the oxygen-containing material comprises copper oxide and/or zirconium oxide.

* * * * *